United States Patent [19]

Yamaguchi et al.

[11] Patent Number: 5,015,056
[45] Date of Patent: May 14, 1991

[54] PHOTOINTERRUPTOR FOR USE IN LIGHT-TRANSMISSION TYPE ROTARY ENCODER

[75] Inventors: Kazuo Yamaguchi; Yoshi Kurosawa; Seiichi Sato, all of Tokyo; Atsushi Ueda; Masami Matsumura, both of Hyogo, all of Japan

[73] Assignees: Optec D.D. Melco Laboratory Co., Ltd.; Optec Dai-Ichi Denko Co., Ltd., both of Higashikurume; Mitsubishi Denki Kabushiki Kaisha, Tokyo, all of Japan

[21] Appl. No.: 580,645

[22] Filed: Sep. 11, 1990

[30] Foreign Application Priority Data

Sep. 12, 1989 [JP] Japan .............................. 1-106131[U]

[51] Int. Cl.$^5$ .......................... G02B 6/26; G02B 6/40; G06K 7/10
[52] U.S. Cl. ............................ 350/96.15; 350/96.10; 350/96.20; 350/96.22; 350/96.24; 250/227.11; 250/227.21; 250/570; 250/233
[58] Field of Search .............. 350/96.10, 96.15, 96.16, 350/96.20, 96.21, 96.24, 96.22; 250/227.11, 570, 227.21, 233, 239

[56] References Cited

U.S. PATENT DOCUMENTS

| | | |
|---|---|---|
| 3,542,451 | 11/1970 | Washburn ................ 350/96.24 X |
| 3,917,383 | 11/1975 | Cook et al. .................. 350/96.22 |
| 3,999,062 | 12/1976 | Demsky et al. ................ 250/233 |
| 4,075,478 | 2/1978 | Walker ...................... 250/233 |
| 4,116,000 | 9/1978 | Martin ..................... 350/96.24 X |
| 4,503,326 | 3/1985 | Searle ..................... 350/96.24 X |
| 4,604,725 | 8/1986 | Davies et al. ................. 250/233 |
| 4,829,165 | 5/1989 | Kalawsky .................. 250/227.21 |
| 4,875,751 | 10/1989 | Ostermeier ................ 350/96.24 X |

Primary Examiner—Brian Healy
Attorney, Agent, or Firm—Cushman, Darby & Cushman

[57] ABSTRACT

A photointerruptor for use in a light transmission type rotary encoder comprising a photointerruptor main body having a plurality pair of light emitting and light receiving optical fibers resin-molded therein, each pair of the optical fibers being disposed such that their end faces are opposed on both sides of each code pattern formed circumferentially on a pulse scale, the light emitting optical fibers joined by way of an optical branching device into a light input end and the light receiving optical fibers being extended in parallel with each other through the photointerruptor and, an adaptor integrally formed to the photointerruptor main body and through which the light input end of the light emitting optical fibers and the light emitting ends of the light receiving optical fibers are extended and arranged such that they are collectively connected with core wires of a multi-cored transmission optical fiber cable by way of a light connector respectively.

1 Claim, 2 Drawing Sheets

PHOTOINTERRUPTOR FOR USE IN LIGHT-TRANSMISSION TYPE ROTARY ENCODER

BACKGROUND OF THE INVENTION

1. Field of the Invention

The present invention concerns a photointerruptor for use in a light transmission type rotary encoder capable of obtaining optical pulse signals in accordance with an angle of rotation of a pulse scale having a plurality of code patterns formed thereon and, more specifically, it relates to a photointerruptor for use in a light transmission type rotary encoder which is suitably incorporated, for example, as a sensor for detecting a crank angle in an automobile engine.

2. Description of the Prior Art

Photointerruptors for use in light transmission type rotary encoders include a so-called device type photointerruptor in which a pair of light emitting device and a photoreceiving device are integrally resin-molded such that they are opposed on both sides of a code pattern on a pulse scale and a so-called optical fiber type photointerruptor in which a pair of light emitting optical fiber and a light receiving optical fiber are resin-molded such that their end faces are opposed to each other.

As shown later in FIG. 3 of the appended drawings, light emitting devices 31, 31 and photoreceiving devices 32, 32 are opposed on both sides of code patterns $C_1$, $C_2$ formed along the circumference of a pulse scale 1 in the device type photointerruptor.

However, when the device type photointerruptor is used, for example, to a light transmission type rotary encoder as a sensor for detecting a crank angle in an automobile engine, since the photointerruptor is exposed to severe circumstances such as high temperature, violent vibrations, or electromagnetic noises in an engine room, there may be possibly caused degradation of the light emitting devices 31, 31 and the photoreceiving devices 32, 32, disconnection of power feed lines or signal lines, failure of contact in connection portions, etc. due to vibrations. Further, there is also a worry of misoperation caused by electromagnetic noises and no accurate detection of angle can be conducted.

On the other hand, in the optical fiber type photointerruptor, as shown later in FIG. 4, light emitting optical fibers 41, 41 and light receiving optical fibers 42, 42 are disposed, instead of the light emitting devices 31, 31 and photoreceiving devices 32, 32, on both sides of code patterns $C_1$, $C_2$ formed on a pulse scale such that end faces of the fibers are opposed to each other.

When the optical fiber type photointerruptor is used for the light transmission type rotary encoder as the sensor for detecting the crank angle in an automobile engine, since the light emitting device and the photoreceiving device can be disposed at a position remote from the engine, the light emitting device and the photoreceiving device can be free from undesirable effects of high temperature or vibrations caused from the engine.

Further, since the optical fiber is electrically noninductive, there is also a merit of causing no misoperation due to electromagnetic noises.

However, in the conventional optical fiber type photointerruptor, if a plurality of code patterns are formed on the pulse scale 1 since light emitting optical fibers disposed on each of the code patterns are connected respectively to the light emitting devices, the number of parts such as the light emitting devices and the light emitting optical fibers is increased to make the structure expensive.

In particular, for improving the signal/noise (S/N) ratio by increasing the intensity of light entering the photoreceiving device as much as possible, it is required to use expensive light emitting devices having high power and high directionality, and the cost is increased remarkably if such expensive light emitting devices are used in plurality.

In addition, since free ends of the respective optical fibers 41, 42 to be connected with light emitting devices and the photoreceiving devices are extended to the outside of a photointerruptor main body 43, they have to be handled with a great care so as not to injure or flex the optical fibers 41, 42, for example, upon packaging or transporting the photointerruptor 43, and this enforces much inconveniency for the handling.

Furthermore, upon installing operation of the rotary encoder, wiring operations for connecting each of the optical fibers 41, 42 with the light emitting devices or the photoreceiving device, or bundling and fixing them are extremely troublesome. In addition, when the photointerruptor main body 43 is mounted to a narrow place, for example, in an engine room of an automobile, optical fibers 41, 42 may possibly be damaged or flexed.

OBJECT OF THE PRESENT INVENTION

It is, accordingly, an object of the present invention to provide a photointerruptor for use in a light transmission type rotary encoder capable of reducing the number of parts disposed on the light emitting side thereby reducing the cost, free from the worry of injuring light emitting optical fibers and light receiving optical fibers upon handling the photointerruptor, and facilitating wiring operations between the optical fibers and the light emitting device or the photoreceiving device thereby facilitating the handling or the installation operation for the light transmission type rotary encoder.

SUMMARY OF THE INVENTION

The foregoing object of the present invention can be attained according to the present invention in a photointerruptor for use in a light transmission type rotary encoder comprising:

(A) a photointerruptor main body having:

a plurality pair of light emitting optical fibers and light receiving optical fibers resin-molded therein, each pair of light emitting and light receiving optical fibers being disposed such that their end faces are opposed with each other on both sides of each of a pluralty of code patterns formed circumferentially on a pulse scale, the light emitting optical fibers which are joined by way of an optical branching device into a light input end and the light receiving optical fibers being extended in parallel with each other through the photointerruptor and, (B) an adaptor integrally formed to the photointerruptor main body and through which the light input end of the light emitting optical fibers and the light emitting ends of the light receiving optical fibers are extended and arranged such that they are collectively connected with corresponding core wires of a multi-cored transmission optical fiber cable by way of a light connector respectively.

In the present invention, since a pair of light emitting optical fibers are joined into a light input end by way of an optical branching device in the photointerruptor main body, light transmission channel from the light emitting device to the photointerruptor can be constituted with only one optical path and the number of the light emitting device required for the optical path can also be decreased to only one, so that the number of relevant parts can be decreased to reduce the cost.

Further, since the free ends of the respective light emitting optical fibers and the light receiving optical fibers are not exposed as they are but enhoused within the adaptor to be connected with the optical connector for collectively connecting them to a multi-cored transmission optical fiber cable, there is no worry that the optical fibers may be injured or flexed upon packaging, transporting, assembling or installing operation. This makes the handling for the photointerruptor simple and convenient.

In addition, since all the optical fibers can be connected at once collectively by merely connecting the multi-cored transmission optical fiber cable by means of the adaptor, there is no more requirement for individual connection of respective optical fibers, which can facilitate the wiring or installing operation.

BRIEF DESCRIPTION OF THE ACCOMPANYING DRAWINGS

These and other objects, as well as advantageous features of the present invention will become apparent by reading the following descriptions for a preferred embodiment according to the present invention in conjunction with the appended drawings, wherein FIG. 1 is an explanatory view partially in cross section of a photointerruptor for use in a light transmission type rotary encoder according to the present invention;

DESCRIPTION OF THE PREFERRED EMBODIMENT

The present invention will now be described more specifically by way of its preferred embodiment with reference to the appended drawings.

Figure 1:
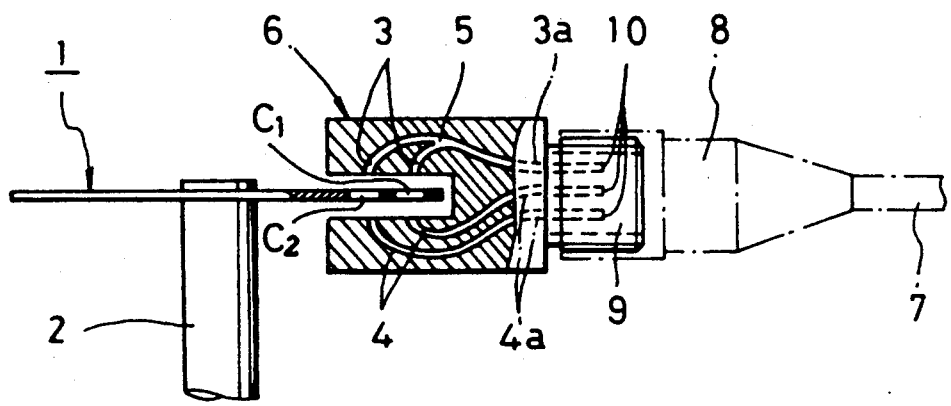
Figure 2:
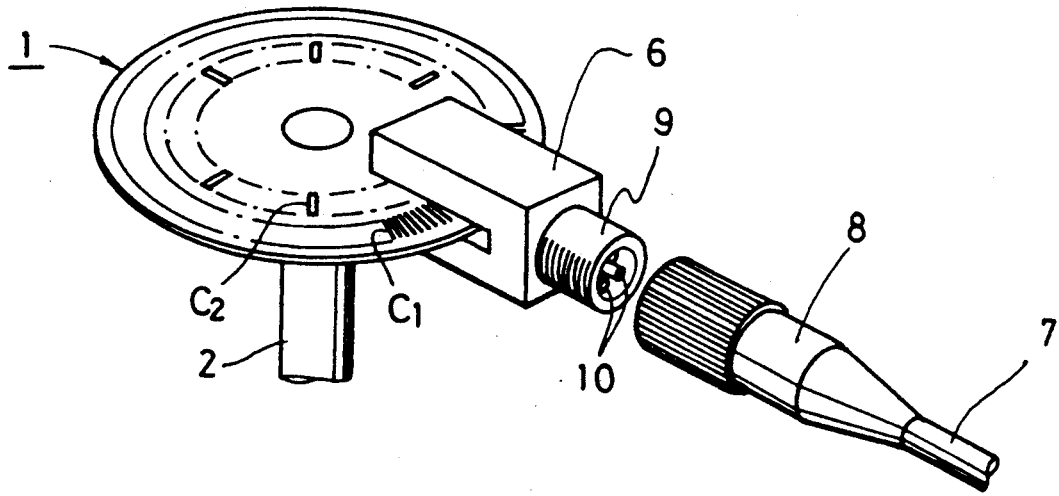
FIG. 2 is a perspective outer view thereof.
Figure 3:
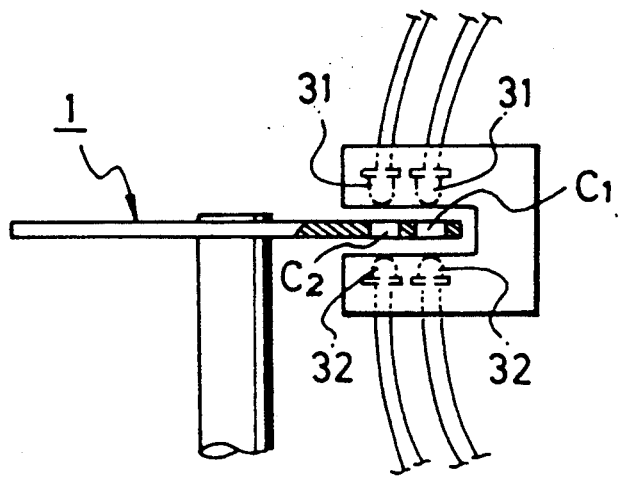
FIGS. 3 and 4 are side elevational views illustrating photointerruptors in the prior art for use in a light transmission type rotary encoder.
Figure 4:
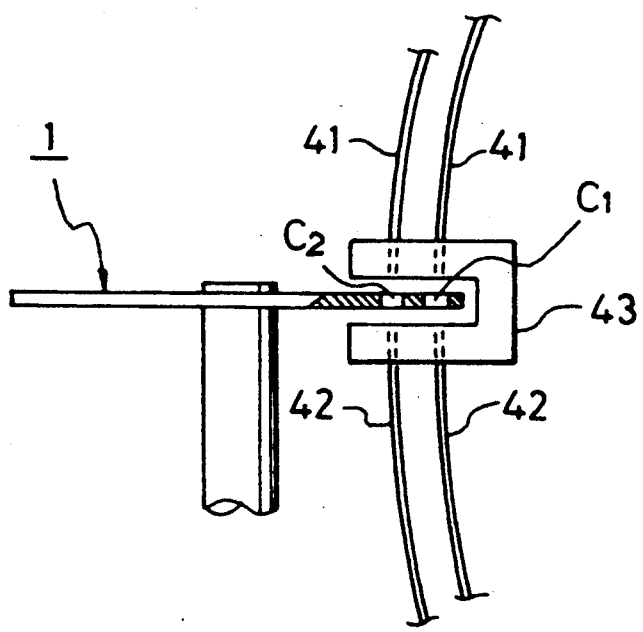

FIG. 1 is a side elevational view partially in cross section for one embodiment of a photointerruptor for use in a light transmission type rotary encoder according to the present invention and FIG. 2 is a perspective view thereof.

In the drawing, a photointerruptor comprises a disk-shaped pulse scale 1 on which two series of code patterns $C_1$ and $C_2$ are formed and a rotational shaft 2 of the scale is connected to a rotational shaft (not illustrated) of a crank shaft in an automobile engine as an object to be measured.

A pair of light emitting optical fibers 3, 3 and a pair of light receiving optical fibers 4, 4 are integrally molded with, for example, an epoxy resin in a photointerruptor main body 6, such that the end faces of the respective optical fibers 3 and 4 are opposed to each other on both sides of each code pattern $C_1$, $C_2$ on the pulse scale 1. The pulse scale 1 and the photointerruptor main body 6 constitutes a light transmission type rotary encoder.

In the photointerruptor main body 6, two light emitting optical fibers 3, 3 are joined by way of an optical branching device 5 into one light input end 3a. The light input end 3a and the light emitting ends 4a, 4a of the light receiving optical fibers 4, 4 are extended in parallel with each other through the photointerruptor main body 6.

An adaptor 9 is integrally formed to the photointerruptor main body 6 on the side that the ends of the optical fibers 3,3 and 4,4 are led out for collective connection with a multi-cored transmission optical fiber cable 7.

More specifically, the light emitting optical fibers 3, 3 and the light receiving optical fibers 4, 4 are extended in one identical direction through the photointerruptor main body 6 toward the adaptor 9. The light emitting optical fibers 3, 3 are joined through the optical branching device 5 into the light input end 3a, which is then inserted through a ferrule 10 of the adaptor 9, while each of the light emit ends 4a of the light receiving optical fibers 4, 4a is inserted into each of ferrules 10, 10 of the adaptor 9.

The optical branching device 5, for example, of a wave guide coupling type is used so that light emitted form one input end 3a may be branched and supplied to each of the light emitting optical fibers 3, 3.

In this embodiment, even if a plurality of light emitting optical fibers 3, 3—are used, only one light transmission optical fiber is required for connection between the light emitting device and the photointerruptor, so that the number of the optical fibers and the light emitting devices can be reduced. In addition, the structure of the multi-cored light transmission optical fiber cable 7 can also be simplified with respect to the number of core wires. Further, the size and the structure of the optical connector 8 and the adaptor 9 can also be simplified as the number of core wires is decreased.

The function and the operation of the preferred embodiment according to the present invention having thus been constituted will now be explained.

On assembling the light transmission type rotary encoder, the photointerruptor main body 6 is at first positioned in place and set to a casing (not illustrating) such that each pair of the light emitting optical fiber and the light receiving optical fiber are opposed at their respective one end faces to each other on both sides of each code pattern $C_1$, $C_2$ formed on the pulse scale 1.

The optical fibers 3 and 4 are extended through the inside of the photointerruptor main body 6 and connected to the adaptor 9, without exposing the free ends of the optical fibers 3 and 4 from the outside of the main body 6. Accordingly, there is no worry that the optical fibers are injured or flexed, for example, upon packaging, transporting, assembling or installing operation.

In a case of mounting the light transmission type optical encoder as a sensor for detecting a crank angle in an automobile engine, the rotational shaft 2 of the pulse scale 1 is connected with a crank shaft of the engine. Then, the multi-cored light transmission optical fiber cable 7 is connected at one end thereof collectively to the adaptor 9 by way of the optical connector 8 and also connected at the other end thereof to a control device on which light emitting device, light receiving device, etc. are disposed (not illustrated).

In this way, the transmitting multi-cored optical fiber cable 7, liable to undergo damages during connection operation, is isolated during the installing operation of the light transmission type rotary encoder, the optical fibers are free from injury or flexure.

In addition, since the multi-cored light transmission optical fiber 7 can be connected collectively by means of the optical connector 8 after installing the light transmitting rotary encoder, connecting operation can be made simply and rapidly even in a restricted narrow space such as an engine room of an automobile.

Furthermore, since the light emitting optical fibers 3, 3 in the photointerruptor main body 6 is joined by means of the optical branching device 5 into the optical input end 3a the number of the optical fibers between the photointerruptor main body 6 and the light emitting device can be reduced only to one and the number of core wires in the multi-cored light transmission optical fiber cable 7 can be reduced. Correspondingly, the number of the light emitting device can also be reduced to one. Further, since the size of the optical connector 8 and the adaptor 9 can be reduced as the number of the cores is reduced, the cost of the products can also be decreased.

In the illustrated embodiment, explanation has been made for a 2-bit type photointerruptor, but the present invention is not restricted only to such an embodiment but it is applicable also to plurality bit type photointerruptors.

In particular, when the present invention is applied to a photointerruptor of a greater bit number, the number of parts such as optical fibers used in the path leading to the light emitting device, the light emitting device per se, etc. can be reduced remarkably to contribute much to the reduction of the size and the cost of the photointerruptor.

The present invention can also be applied, for example, to a 8 bit type photointerruptor in which they are divided each by 4 bits into two sets each of which is joined a light input end, such that there are two light input ends 3a.

As many apparently widely different embodiments of this invention may be made without departing from the spirit and scope thereof, it is to be understood that the invention is not limited to the specific embodiments thereof except as defined in the appended claims.

What is claimed is:

1. A photointerruptor for use in a light transmission type rotary encoder comprising:
    (A) a photointerruptor main body having:
        a plurality pair of light emitting optical fibers and light receiving optical fibers resin-molded therein, each pair of light emitting and light receiving optical fibers being disposed such that their end faces are opposed with each other on both sides of each of a plurality of code patterns formed circumferentially on a pulse scale,
        said light emitting optical fibers which are joined by way of an optical branching device into a light input end and said light receiving optical fibers being extended in parallel with each other through said photointerruptor and,
    (B) an adaptor integrally formed to said photointerruptor main body and through which the light input end of said light emitting optical fibers and the light emitting ends of said light receiving optical fibers are extended and arranged such that they are collectively connected with corresponding core wires of a multi-cored transmission optical fiber cable by way of a light connector respectively.

* * * * *